(12) United States Patent
Komatsu et al.

(10) Patent No.: US 11,289,403 B2
(45) Date of Patent: Mar. 29, 2022

(54) MULTI-LAYER SUBSTRATE AND METHOD FOR MANUFACTURING MULTI-LAYER SUBSTRATE

(71) Applicant: SHINKO ELECTRIC INDUSTRIES CO., LTD., Nagano (JP)

(72) Inventors: Misaki Komatsu, Chino (JP); Katsuya Fukase, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 18 days.

(21) Appl. No.: 16/728,051

(22) Filed: Dec. 27, 2019

(65) Prior Publication Data
US 2020/0219794 A1 Jul. 9, 2020

(30) Foreign Application Priority Data
Jan. 9, 2019 (JP) .............................. JP2019-002179

(51) Int. Cl.
H01L 23/48 (2006.01)
H01L 21/02 (2006.01)
H01L 23/522 (2006.01)
H01L 23/528 (2006.01)
H05K 1/02 (2006.01)
(Continued)

(52) U.S. Cl.
CPC .......... *H01L 23/481* (2013.01); *H01L 21/022* (2013.01); *H01L 23/5226* (2013.01); *H01L 23/5286* (2013.01); *H05K 1/0271* (2013.01); *H05K 2201/2072* (2013.01)

(58) Field of Classification Search
CPC ........ B81C 1/00039; H05K 2201/0969; H05K 1/0271; H05K 1/115; H05K 1/113–116; H05K 2201/2072; H01L 2224/80897; H01L 2224/81897; H01L 2224/83897; H01L 2224/18301; H01L 21/022; H01L 23/49822; H01L 23/481; H01L 23/5226; (Continued)

(56) References Cited

U.S. PATENT DOCUMENTS 6,441,494 B2 * 8/2002 Huang .............. H01L 21/76805
257/758
6,946,737 B2 * 9/2005 Sir .................... H01L 23/49827
257/698
(Continued)

FOREIGN PATENT DOCUMENTS

JP 11-251753 9/1999

*Primary Examiner* — Phat X Cao
*Assistant Examiner* — Diana C Vieira
(74) *Attorney, Agent, or Firm* — Rankin, Hill & Clark LLP

(57) ABSTRACT

A multi-layer substrate includes: a first insulating layer; a conductor layer that is provided on an upper surface of the first insulating layer and that has a penetrating portion; a second insulating layer that covers the conductor layer and that is stacked on the upper surface of the first insulating layer; a via hole that penetrates the second insulating layer from an upper surface of the second insulating layer to reach an inside of the first insulating layer and that includes the penetrating portion; and an insulating member with which the via hole is filled. The conductor layer has a portion exposed in the via hole, and the insulating member covers an upper surface and a lower surface of the conductor layer exposed in the via hole through the penetrating portion of the conductor layer.

12 Claims, 15 Drawing Sheets

(51) Int. Cl.
*H01L 23/498* (2006.01)
*H01L 21/48* (2006.01)

(58) Field of Classification Search
CPC .......... H01L 23/5286; H01L 23/49827; H01L 21/486; H01L 23/562; H01L 23/564
See application file for complete search history.

(56) References Cited

U.S. PATENT DOCUMENTS

| | | | |
|---|---|---|---|
| 7,312,400 B2 * | 12/2007 | Ito | H05K 3/4069 |
| | | | 174/250 |
| 7,446,036 B1 * | 11/2008 | Bolom | H01L 21/76805 |
| | | | 257/E21.585 |
| 10,401,696 B2 * | 9/2019 | Watanabe | H05K 3/366 |
| 2017/0188458 A1 * | 6/2017 | Hsieh | H05K 1/111 |
| 2018/0031932 A1 * | 2/2018 | Koide | G02F 1/133345 |

* cited by examiner

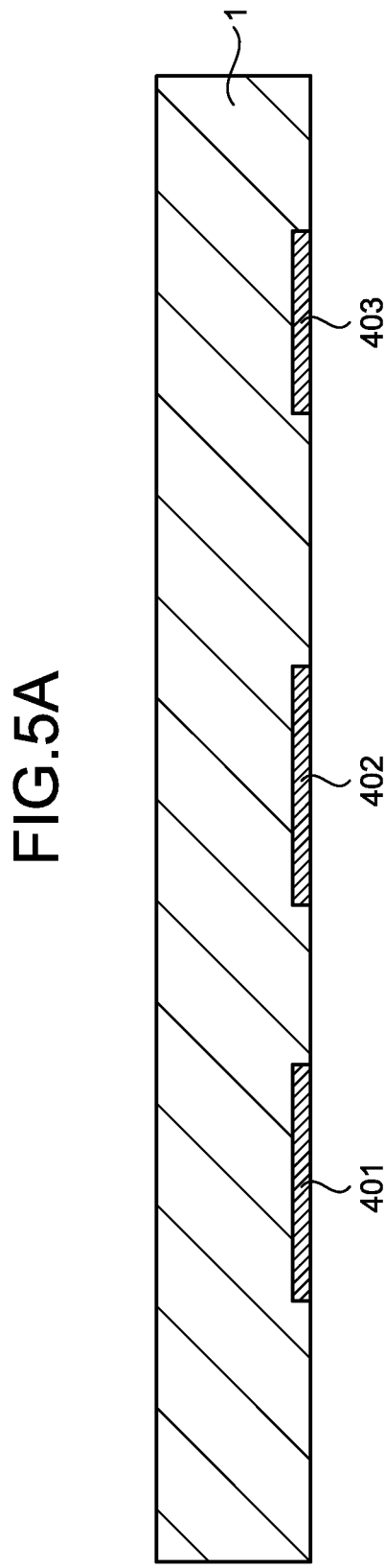

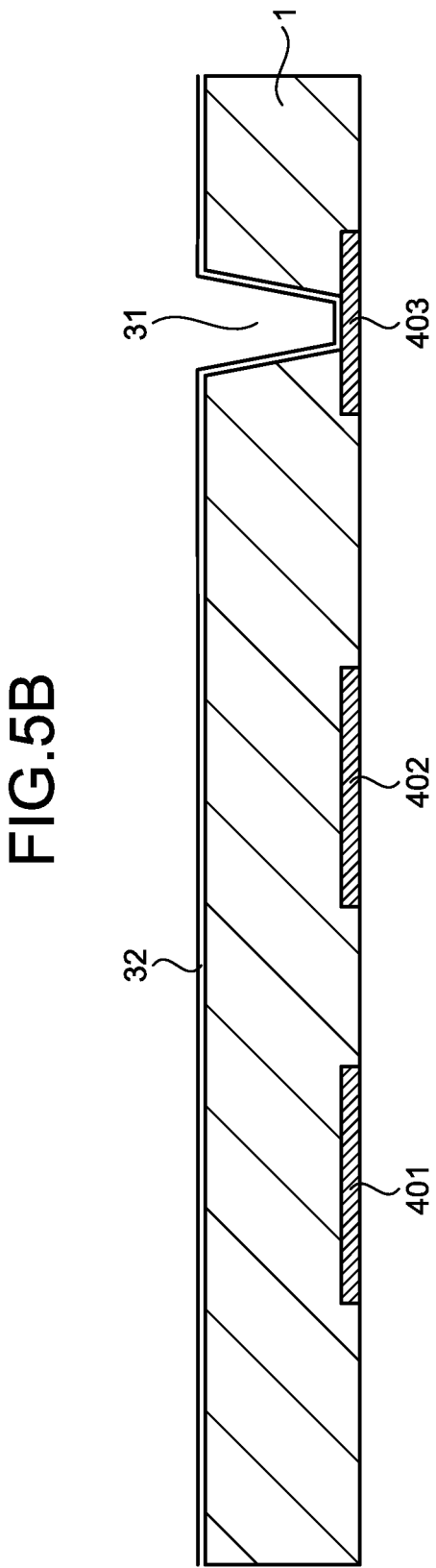

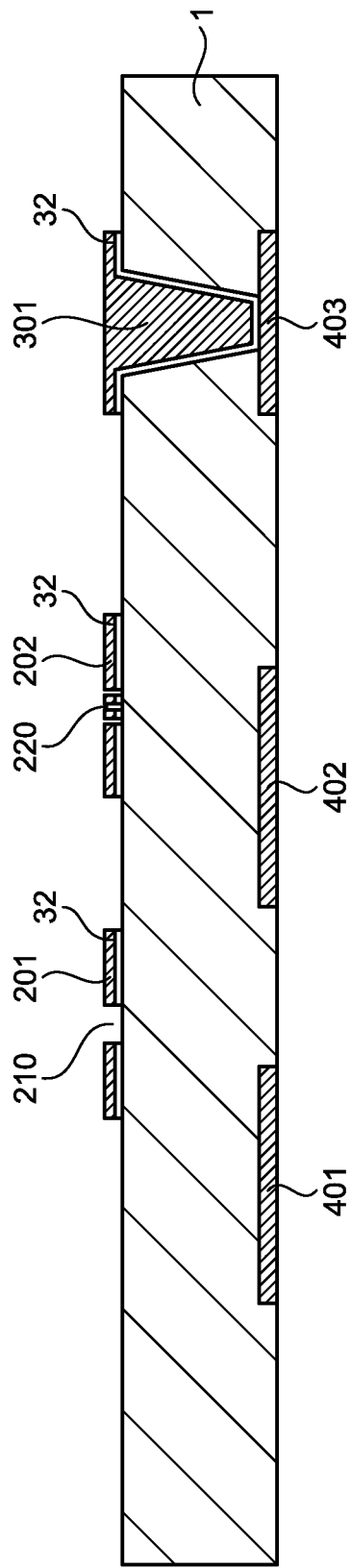

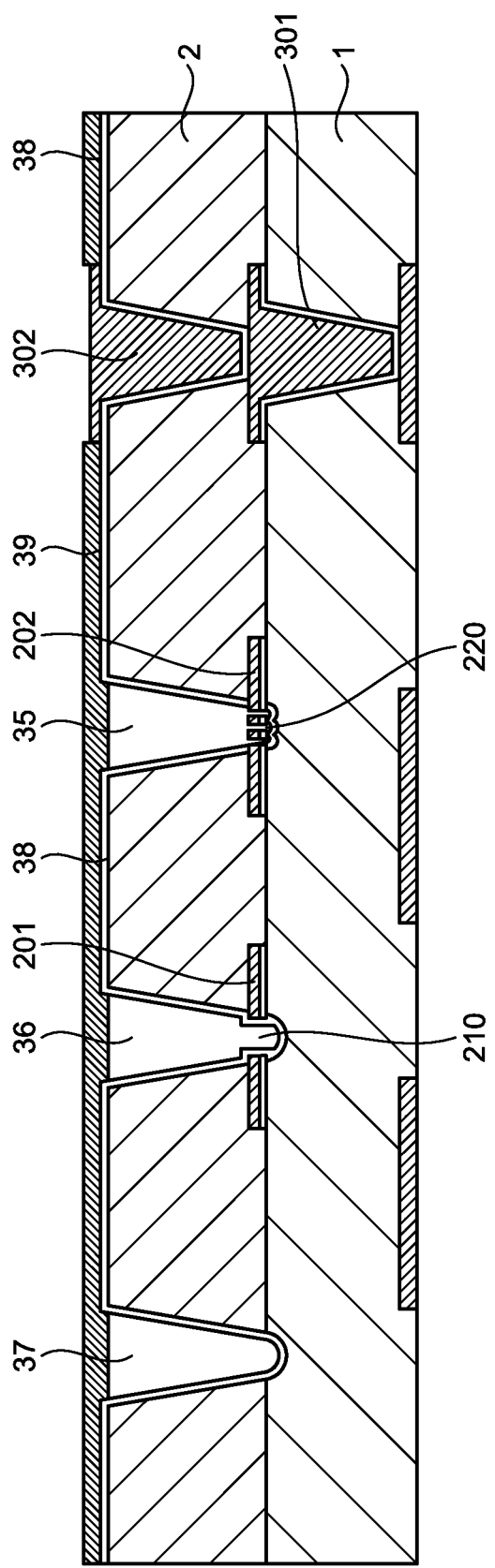

MULTI-LAYER SUBSTRATE AND METHOD FOR MANUFACTURING MULTI-LAYER SUBSTRATE

CROSS-REFERENCE TO RELATED APPLICATION(S)

This application is based upon and claims the benefit of priority of the prior Japanese Patent Application No. 2019-002179, filed on Jan. 9, 2019, the entire contents of which are incorporated herein by reference.

FIELD

The embodiment discussed herein is related to a multi-layer substrate and a method for manufacturing a multi-layer substrate.

BACKGROUND

In recent years, electronic devices have been constantly improving in performance. Along with the improvement in performance of electronic devices, wiring boards on which various electronic components are mounted allows mounting with higher density, and a multi-layer substrate in which wirings are formed across a plurality of layers has become common.

The multi-layer substrate is generally a multi-layer wiring substrate including a plurality of insulating layers and wiring layers stacked on the upper and lower sides of the core substrate, and vias connecting the wiring layers to each other. Such a multi-layer substrate is formed by, for example, a build-up method and is also called a build-up substrate.

A multi-layer substrate formed by sequentially stacking an insulating material layer and a conductor layer made of copper generally has three types of interface described below. The first interface is an interface in a state where on the surface of one insulating material layer, another insulating material layer is directly stacked. The second interface is an interface in a state where a conductor layer is plated on the surface of an insulating material layer. The third interface is an interface in a state where an insulating material layer is stacked on the surface of a conductor layer to/on which a surface roughening treatment is applied or an adhesion layer is formed. Furthermore, when the conductor via that penetrates an insulating material layer and that is connected to a conductor layer is formed, there exists an interface in a state where the conductor via is plated on the conductor layer.

Patent Literature 1: Japanese Laid-open Patent Publication No. 11-251753

The multi-layer substrate is subjected to various types of treatment that apply heat thereto in the manufacturing process, the electronic component mounting process, and the like. When the stress generated at each interface due to various thermal histories in such treatment becomes larger than the adhesion force at the interface, the interface is stripped. Hereinafter, the stripping of the interface is referred to as delamination.

At the interface where on the surface of one insulating material layer, another insulating material layer is directly stacked, which is the above-described first interface, there is a concern about the occurrence of delamination and the propagation of delamination occurred at another interface.

Furthermore, an interface between the metal and the resin has a weaker adhesion force than an interface between the resin and the resin. For this reason, for example, a roughening treatment is applied or an adhesion layer is formed to/on the above-described second and third interfaces in order to increase the adhesion force on the surface of the conductor layer. However, in a case of an interface having a large area where a conductor layer and an insulating material layer are in contact with each other, such as a dummy pattern, a ground plane, or a power plane, interfaces having weak adhesion force are arranged successively, so that a risk of occurrence of delamination and propagation of delamination increase.

When delamination occurs, moisture is easily collected in the portion, and there is a risk that a space formed by the delamination swells in the thermal history of the post-process. Then, the swelling of the space formed by delamination may lead to occurrence of new delamination. Furthermore, when the delamination reaches the interface formed by the conductor layer and the conductor via, the electrical conduction between the conductor layers is cut off, which may reduce the electrical connection reliability.

SUMMARY

According to an aspect of an embodiment, a multi-layer substrate includes: a first insulating layer; a conductor layer that is provided on an upper surface of the first insulating layer and that has a penetrating portion; a second insulating layer that covers the conductor layer and that is stacked on the upper surface of the first insulating layer; a via hole that penetrates the second insulating layer from an upper surface of the second insulating layer to reach at least an inside of the first insulating layer and that includes the penetrating portion of the conductor layer; an insulating member with which the via hole is filled; and a third insulating layer that is stacked on the upper surface of the second insulating layer and that is formed integrally with the insulating member. The conductor layer has a portion exposed in the via hole, and the insulating member covers an upper surface of the conductor layer exposed in the via hole and covers a lower surface of the conductor layer exposed in the via hole through the penetrating portion of the conductor layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5A is a diagram illustrating a method for manufacturing the build-up substrate according to the embodiment;

FIG. 5B is a diagram illustrating a method for manufacturing the build-up substrate according to the embodiment;

FIG. 5D is a diagram illustrating a method for manufacturing the build-up substrate according to the embodiment;

FIG. 5H is a diagram illustrating a method for manufacturing the build-up substrate according to the embodiment;

DESCRIPTION OF EMBODIMENT

Hereinafter, an embodiment of a multi-layer substrate and a method for manufacturing a multi-layer substrate disclosed in the present application will be described in detail with reference to the drawings. Note that, the multi-layer substrate and the method for manufacturing a multi-layer substrate disclosed in the present application are not limited by the following embodiments.

Figure 1:
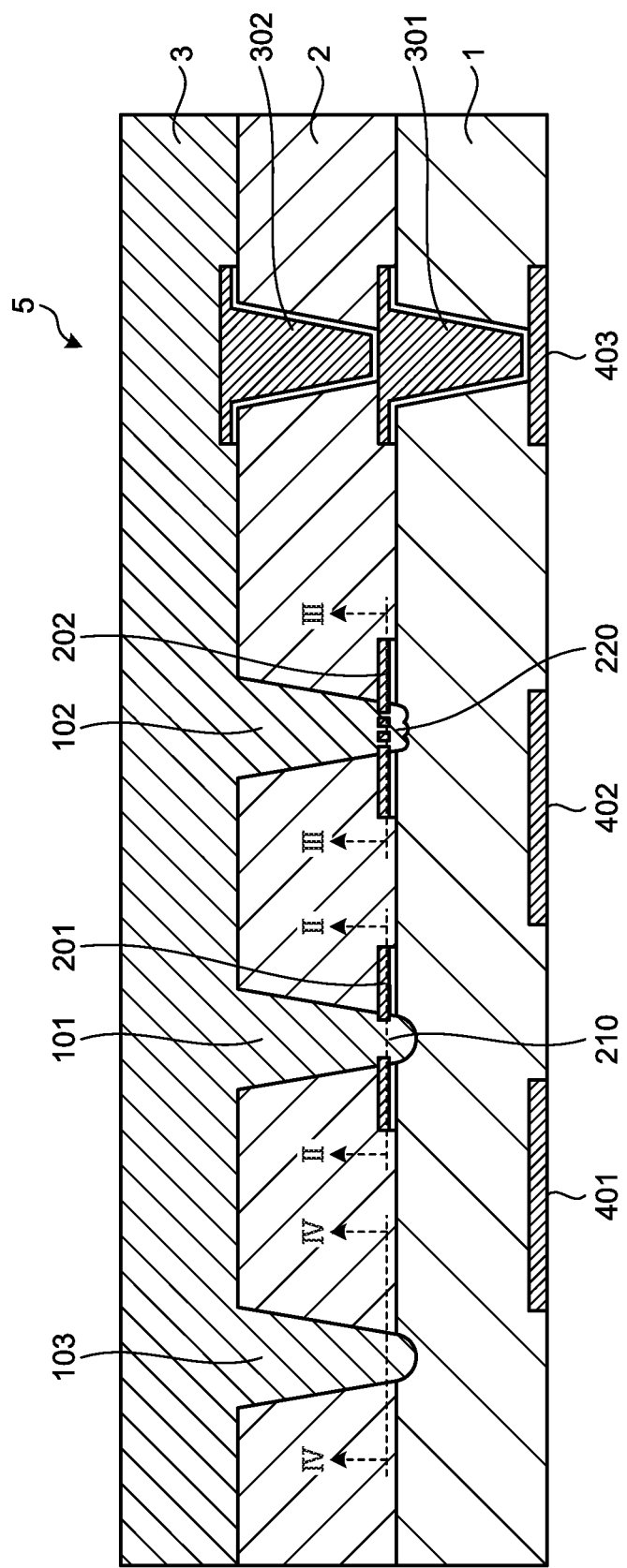
FIG. 1 is a schematic cross-sectional view of a build-up substrate according to an embodiment.

FIG. 1 is a schematic cross-sectional view of a build-up substrate according to an embodiment. A build-up substrate 5 is a board having a plurality of layers, and is a substrate created by using a build-up method for manufacturing a printed circuit board having a multi-layer structure by repeated stacking of insulating material, drilling, wiring formation, and the like for each layer.

As illustrated in FIG. 1, the build-up substrate 5 has a configuration having at least insulating material layers 1 to 3. Here, although three insulating material layers 1 to 3 are illustrated in FIG. 1, the number of stacked layers is not limited. In addition, the insulating material layer 1, which is the lowest layer in FIG. 1, may be a core layer included in the build-up substrate 5. The insulating material layers 1 to 3 each have a thickness of 20 μm to 50 μm, for example. Furthermore, the insulating material layers 1 to 3 respectively correspond to examples of "first insulating layer", "second insulating layer", and "third insulating layer".

FIG. 1 illustrates the configuration of the build-up substrate 5 up to the step where stacking of an insulating material layer 3 is completed. Although description is not provided in the present embodiment, in practice, the build-up substrate 5 is completed by using the build-up method for the processes after the state of FIG. 1.

In the following description, among the surfaces of the insulating material layers 1 to 3, the surface on which an insulating material layer is newly stacked, that is, the surface on the upper side in FIG. 1 is referred to as an "upper surface". For example, the surface of the insulating material layer 1 on the insulating material layer 2 side is the upper surface of the insulating material layer 1. In addition, the surface of the insulating material layer 2 on the insulating material layer 3 side is the upper surface of the insulating material layer 2. Furthermore, the surface opposite to the upper surface, that is, the surface on the lower side in FIG. 1 is referred to as a "lower surface". For example, the surface of the insulating material layer 2 on the insulating material layer 1 side is the lower surface of the insulating material layer 2.

Conductor layers 401 to 403 are disposed on the lower surface side of the insulating material layer 1. The conductor layers 401 to 403 are members made of copper.

Between the insulating material layer 1 and the insulating material layer 2, conductor layers 201 and 202 are disposed. The conductor layers 201 and 202 are members made of copper. The conductor layers 201 and 202 are plate-like members extending in a direction orthogonal to the stacking direction of the build-up substrate 5. In the following description, a direction orthogonal to the stacking direction is referred to as a plane direction. Also for each of the conductor layers 201 and 202, the surface on the insulating material layer 2 side, that is, the surface on the upper side in FIG. 1 is referred to as an "upper surface" and the surface on the insulating material layer 1 side, that is, the surface on the lower side in FIG. 1 is referred to as a "lower surface".

Figure 2:
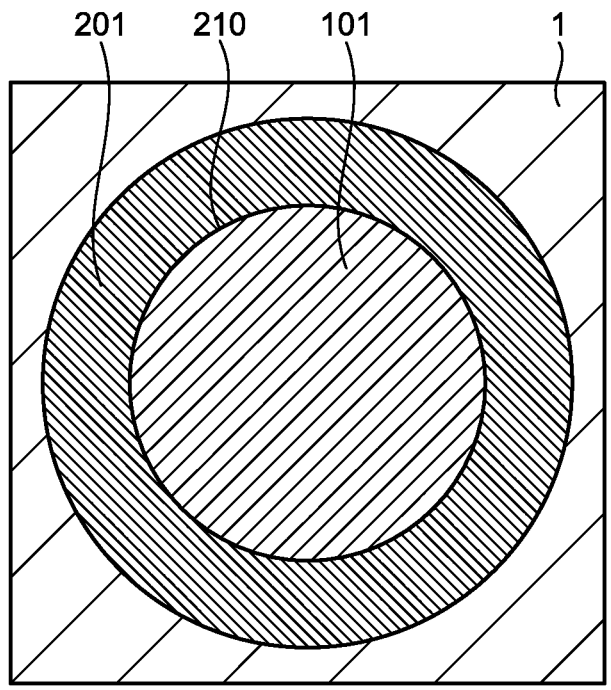
FIG. 2 is a cross-sectional view of a conductor layer in which a resin via penetrates taken along line II-II of FIG. 1.

FIG. 2 is a cross-sectional view of the conductor layer in which a resin via penetrates taken along line II-II of FIG. 1. As illustrated in FIG. 2, the conductor layer 201 has a through hole 210 in the center. Here, in FIG. 2, the shape of the through hole 210 is circle, but the shape of the through hole 210 is not limited to circle, and may be, for example, a quadrangle or a triangle.

Figure 3:
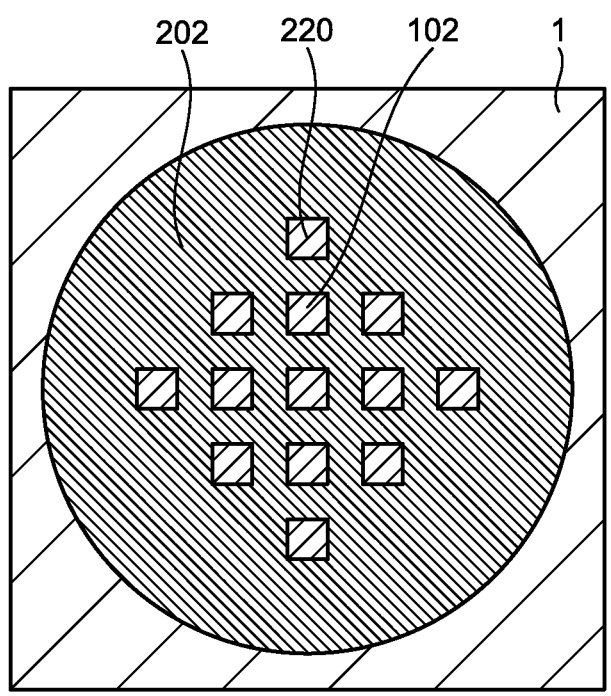
FIG. 3 is a cross-sectional view of the conductor layer in which the resin via penetrates taken along line III-III of FIG. 1.

FIG. 3 is a cross-sectional view of the conductor layer in which the resin via penetrates taken along line III-III of FIG. 1. As illustrated in FIG. 3, in the conductor layer 202, through holes 220 that are small holes are formed closely to each other. The through holes 220 are, for example, degas holes. The degas holes are vent holes provided in a dummy pattern, a ground plane, and a power plane. Here, in FIG. 3, the shape of the through holes 220 is a quadrangle, but the shape of the through holes 220 is not limited to this, and may be, for example, a circle or a triangle. In the present embodiment, degas holes are used as the through holes 220, but the through holes 220 are not limited to degas holes. For example, even in a part where no degas hole exists, through holes 220, which are small holes, may be formed closely to each other in the conductor layer 202 for resin vias. Alternatively, a plurality of holes formed in a mesh shape in a dummy pattern, a ground plane, or a power plane may be used as the through holes 220.

In the insulating material layer 1, a conductive via 301 is disposed. The conductive via 301 is a member formed by filling a via penetrating the insulating material layer 1 with a conductor and bonding the insulating material to the conductor layer 403. The conductive via 301 electrically connects the conductor layers sandwiching the insulating material layer 1 with each other.

In addition, in the insulating material layer 2, a conductive via 302 is disposed. The conductive via 302 is a member that is formed by filling a via penetrating the insulating material layer 2 with a conductor, and that is bonded to the conductor layers sandwiching the insulating material layer 2. The conductive via 302 electrically connects the conductor layers sandwiching the insulating material layer 2 with each other. The conductive via 302 corresponds to an example of a "conductive member".

The build-up substrate 5 has resin vias 101 to 103. The resin vias 101 to 103 are members that are formed by filling holes penetrating the insulating material layer 2 and reaches the insulating material layer 1 with an insulating material at the time of forming the insulating material layer 3, and that are integrated with the insulating material layer 3. The resin vias 101 to 103 have a diameter of 50 µm to 100 µm, for example. The resin vias 101 to 103 correspond to an example of "insulating member", and the holes for forming the resin vias 101 to 103 correspond to an example of "via hole".

The insulating material layers 1 to 3 and the resin vias 101 to 103 are preferably made of materials having excellent adhesion. For the insulating material layers 1 to 3 and the resin vias 101 to 103, for example, a material having a large amount of filler and a small shrinkage is used. In addition, for the insulating material layers 1 to 3, for example, a resin having high electrical characteristic is used. As the insulating material layers 1 to 3 and the resin vias 101 to 103, for example, an epoxy resin is used.

The resin vias 101 to 103 are formed by filling via holes made in the stacking direction from the upper surface of the insulating material layer 2 toward the insulating material layer 1 with an insulating material at the same time when the insulating material layer 3 is stacked on the insulating material layers 1 and 2, which are stacked. In the present embodiment, the resin vias 101 to 103 are formed as portions of the insulating material layer 3. The state in which the resin vias 101 to 103 are formed as portions of the insulating material layer 3 is a state where "the third insulating layer and the insulating member form an integrated member".

In the present embodiment, the shape of the resin vias 101 to 103 in the insulating material layer 2 is the same as the shape of the conductive via 302. For example, the shape of the resin vias 101 to 103 and the conductive via 302 in the insulating material layer 2 is a tapered shape whose diameter decreases from the upper surface to the lower surface of the insulating material layer 2. However, the shape of the resin vias 101 to 103 and the conductive via 302 in the insulating material layer 2 may be other shapes such as a shape perpendicular to the plane direction.

The resin via 101 penetrates the insulating material layer 2 and reaches the inside of the insulating material layer 1. The resin via 101 reaches, for example, one third of the insulating material layer 1. In addition, the resin via 101 is provided through the through hole 210 of the conductor layer 201 to cover at least parts of the both sides of the conductor layer 201. In other words, the resin via 101 is formed in the insulating material layer 2 and the insulating material layer 1 so that the resin via 101 reaches the surface of the conductor layer 201 on the insulating material layer 1 side through the through hole 210 to cover the lower surface of the conductor layer 201. As illustrated in FIG. 2, the through hole 210 of the conductor layer 201 and the hole formed in the insulating material layer 1 are filled with the resin via 101.

The resin via 102 penetrates the insulating material layer 2 and reaches the inside of the insulating material layer 1. The resin via 102 reaches, for example, one third of the insulating material layer 1. In addition, the resin via 102 is provided through each of the through holes 220 of the conductor layer 202 to cover at least parts of the both sides of the conductor layer 202. In other words, the resin via 102 is formed in the insulating material layer 2 and the insulating material layer 1 so that the resin via 102 reaches the surface of the conductor layer 202 on the insulating material layer 1 side through each of the through holes 220 to cover the lower surface of the conductor layer 202. As illustrated in FIG. 3, each of the through holes 220 of the conductor layer 202 and the hole formed in the insulating material layer 1 are filled with the resin via 102.

Figure 4:
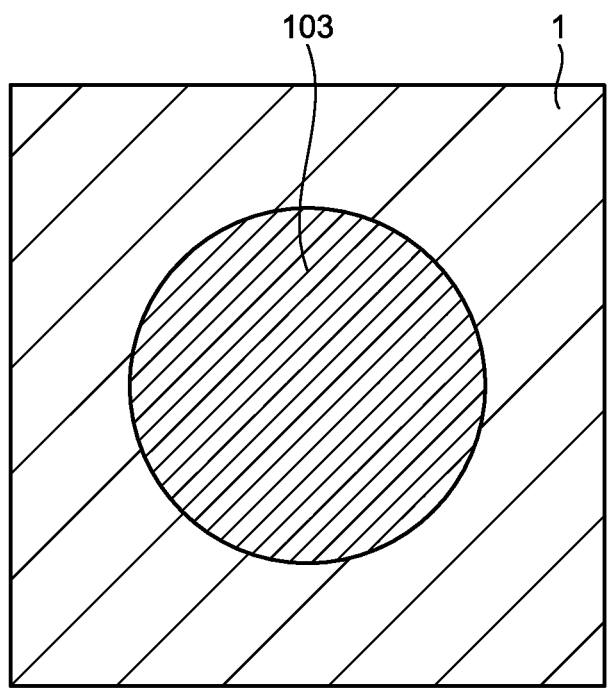
FIG. 4 is a cross-sectional view of a resin via 103 taken along a line IV-IV of FIG. 1.

The resin via 103 penetrates the insulating material layer 2 and reaches the inside of the insulating material layer 1. The resin via 103 reaches, for example, one third of the insulating material layer 1. FIG. 4 is a cross-sectional view of the resin via 103 taken along a line IV-IV of FIG. 1. As illustrated in FIG. 4, the resin via 103 extends across the interface between the insulating material layer 2 and the insulating material layer 1 and fills the hole formed in the insulating material layer 1.

The resin vias 101 to 103 are bonded to the insulating material layers 1 and 2. When the resin vias 101 to 103 are bonded to the insulating material layers 1 and 2, the region where the insulating material layer 3 is in close contact is increased, and the adhesion force is improved. The resin vias 101 to 103 are preferably arranged in line in order to increase the adhesion force.

Since the resin vias 101 and 102 are provided such that the resin vias 101 and 102 cover at least parts of the both sides of the conductor layers 201 and 202, respectively, the adhesion force between the conductor layers 201 and 202 and the insulating material layer 3 is improved by the anchor effect. In addition, since the resin vias 101 and 102 are formed integrally with the insulating material layer 3, the adhesion force between the insulating material layer 2 and the insulating material layer 3 is also improved by the anchor effect described above.

Here, in FIG. 1, in order to facilitate understanding of the insulating material layers 1 to 3, gaps are provided between the layers, but actually, the insulating material layers 1 to 3 are bonded and adhered to each other.

Next, with reference to FIGS. 5A to 5I, a method for manufacturing the build-up substrate 5 according to the embodiment will be described. FIGS. 5A to 5I are diagrams illustrating a method for manufacturing the build-up substrate according to the embodiment.

As illustrated in FIG. 5A, an insulating material layer 1 is disposed. Although not illustrated in the drawing, the insulating material layer 1 is stacked on a support used in manufacturing the build-up substrate 5, a core layer included in the build-up substrate 5, or another insulating material layer. Here, the conductor layers 401 to 403 are disposed on the lower surface side of the insulating material layer 1. The conductor layers 401 to 403 are formed on a support used in manufacturing the build-up substrate 5, a core layer included in the build-up substrate 5, or another insulating material layer (not illustrated), for example, by electrolytic copper plating. Further, a roughening treatment may be applied to or an adhesion layer may be formed on the surfaces of the conductor layers 401 to 403 to improve adhesion to the insulating material layer 1.

Next, as illustrated in FIG. 5B, a hole is formed by laser ablation from the upper surface of the insulating material layer 1 toward the conductor layer 403 to form a via 31 reaching the conductor layer 403. Specifically, the insulating material layer 1 made of resin is sublimated by heat by laser irradiation. At this time, the conductor layer 403 made of metal is difficult to be sublimated even by laser irradiation, and therefore the via 31 has the conductor layer 403 at the bottom.

Next, a desmear treatment for removing resin residue (smear) in the via 31 is applied. As the desmear treatment, for example, wet desmear method or the like can be used. Next, electroless copper plating is applied to the upper surface of the insulating material layer 1 including the via 31 to form a seed layer 32. Here, the seed layer 32 may be formed by various methods such as sputtering other than electroless copper plating.

Figure 5C:
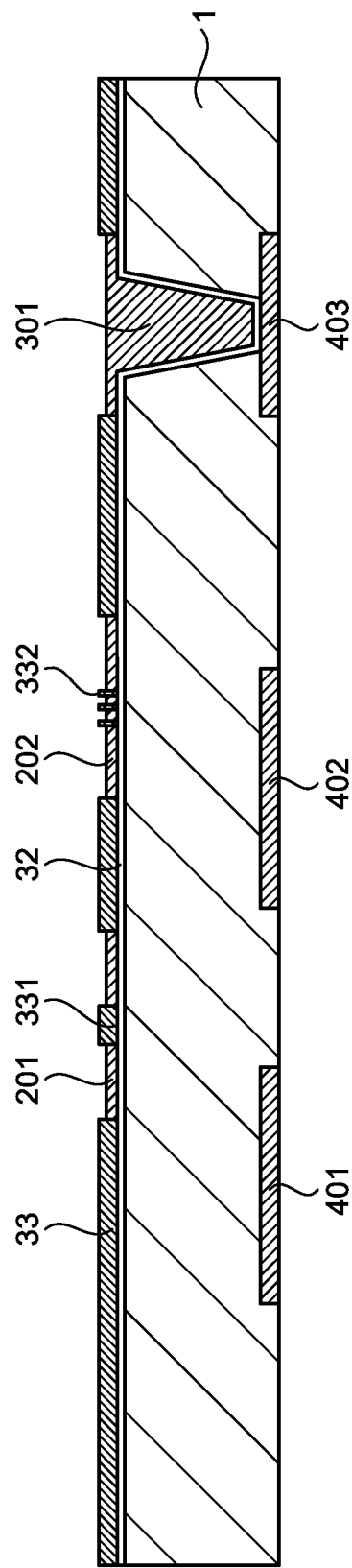
FIG. 5C is a diagram illustrating a method for manufacturing the build-up substrate according to the embodiment.

Next, Dry Film Resist (DFR) is laminated on the seed layer 32 on the upper surface of the insulating material layer 1 including the via 31. Next, exposure and development are performed to form a DFR pattern 33. In the present embodiment, a pattern 331 for forming the through hole 210 is formed at a position where the conductor layer 201 is formed. In addition, a pattern 332 for forming the through holes 220 is formed at a position where the conductor layer 202 is formed. Next, electrolytic copper plating is applied to the DFR pattern 33. In this manner, the conductor layers 201 and 202 are formed. In this case, electrolytic copper plating is not applied to the locations of the patterns 331 and 332. In addition, via fill plating is applied to the via 31 by this electrolytic copper plating, and the conductive via 301 connected to the conductor layer 403 is formed. As a result, the state illustrated in FIG. 5C is obtained.

Next, the DFR is stripped and removed using a stripping solution. Next, the seed layer 32 exposed on the upper surface of the insulating material layer 1 is removed by etching. As a result, the state illustrated in FIG. 5D is obtained. Here, the through hole 210 is formed in the conductor layer 201. Further, the through holes 220 are formed in the conductor layer 202.

Figure 5E:
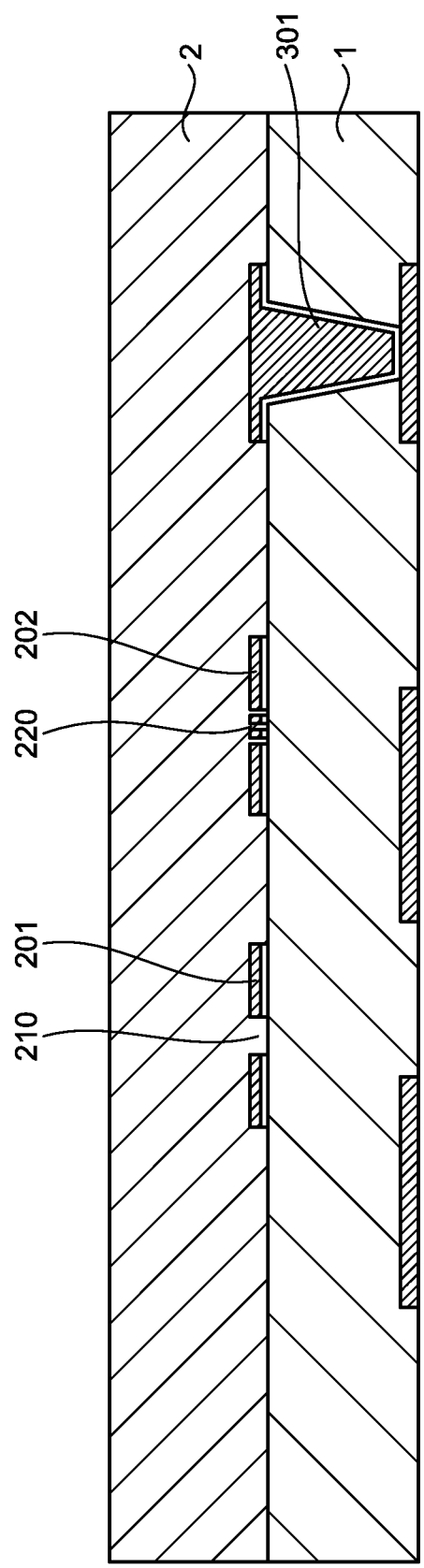
FIG. 5E is a diagram illustrating a method for manufacturing the build-up substrate according to the embodiment.

Next, as illustrated in FIG. 5E, the insulating material layer 2 is stacked on the upper surface of the insulating material layer 1. Note that before the step of stacking the insulating material layer 2, a roughening treatment may be applied to, an adhesion layer may be formed on, or other types of treatment may be applied to the surfaces of the conductor layers 201 to 202 to improve the adhesion to the insulating material layer 2.

Figure 5F:
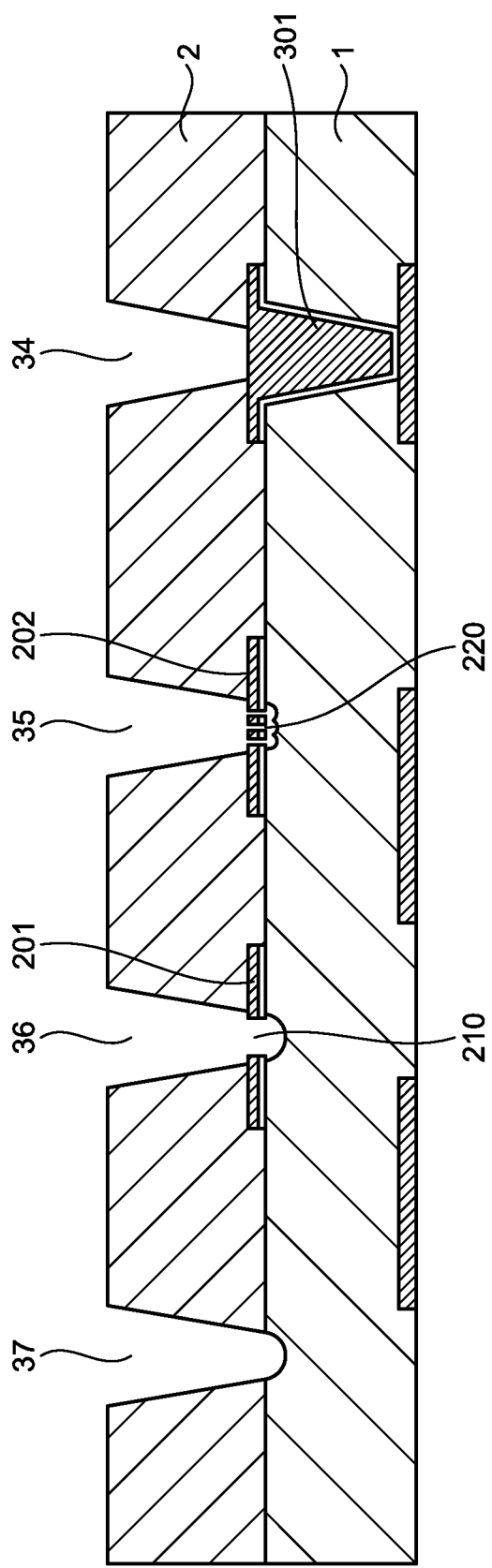
FIG. 5F is a diagram illustrating a method for manufacturing the build-up substrate according to the embodiment.

Next, as illustrated in FIG. 5F, vias 34 to 37 are formed by laser ablation from the upper surface of the insulating material layer 2. Specifically, the insulating material layer 2 made of resin is sublimated by heat by laser irradiation.

For the via 34, a hole is formed to reach the upper surface of the conductive via 301. Since the metal is difficult to be sublimated even by laser irradiation, the via 34 has the upper surface of the conductive via 301 at the bottom.

Furthermore, laser ablation through the through holes 210 and 220 also sublimates the regions on the back of the conductor layers 201 and 202 in the insulating material layer 1. On the other hand, the metal is difficult to be sublimated even by laser irradiated, so that the via 36 is formed leaving the conductor layer 201 and the via 35 is formed leaving the conductor layer 202.

Figure 6A:
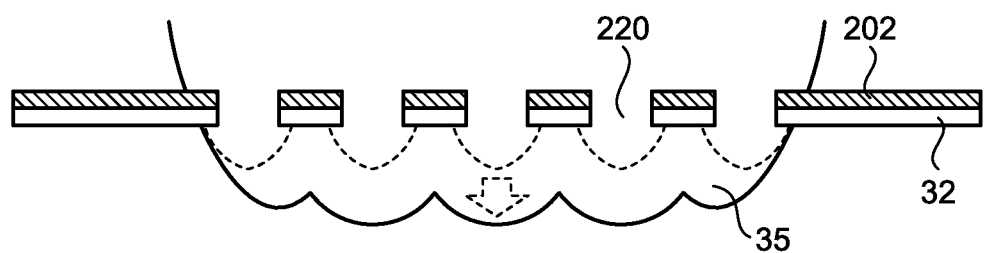
FIG. 6A is a diagram for describing laser ablation through degas holes.

Here, the ablation of the via 35 will be described with reference to FIG. 6A. FIG. 6A is a diagram for describing laser ablation through the degas holes.

The laser makes holes in the insulating material layer 1 through the through holes 220, which are degas holes. When the ablation of the insulating material layer 1 is started, a hole is formed for each of the through holes 220. Further, when laser is irradiated, the holes at the bottom of the through holes 220 in the insulating material layer 1 are connected in the plane direction, and the via 35 having an uneven shape at the bottom is formed.

Figure 6B:
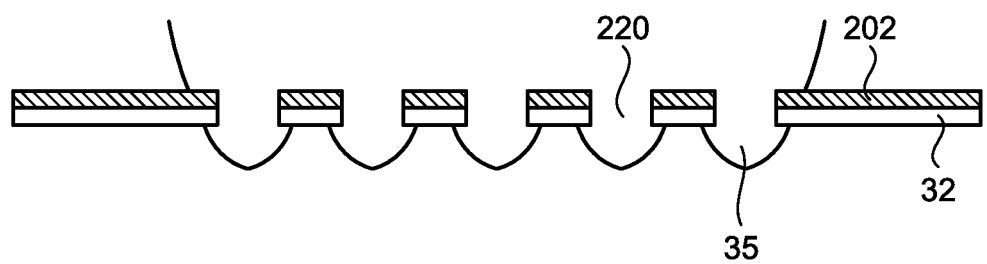
FIG. 6B is a diagram illustrating another shape of a via penetrating degas holes.

Here, in the present embodiment, a hole that connects the spaces of the through holes 220, which are formed in the conductor layer 202, on the insulating material layer 1 side is formed as the via 35, but the via 35 may have other shapes. For example, the portion of the via 35 on the insulating material layer 1 side may have a shape having separate holes formed for the through holes 220 in the insulating material layer 1 as illustrated in FIG. 6B. That is, the via 35 may have a shape in which holes at the bottom of the through holes 220 are not connected in the plane direction. FIG. 6B is a diagram illustrating another shape of the via penetrating the degas holes.

The description is continued referring back to FIG. 5F. For the via 37, a hole is formed such that the hole reaches the inside of the insulating material layer 1. The shapes of the vias 34 to 37 in the insulating material layer 2 are the same. Here, since holes for the vias 34 to 37 are simultaneously formed by laser irradiation in the same process, the number of manufacturing processes does not increase even if the number of the vias 34 to 37 increases.

Thereafter, the desmear treatment for removing the resin residue (smear) in the vias 34 to 37 is applied, and then the electroless copper plating is applied to the upper surface of the insulating material layer 2 including the vias 34 to 37 to form a seed layer 38. As a result, the state illustrated in FIG. 5G is obtained.

Figure 5G:
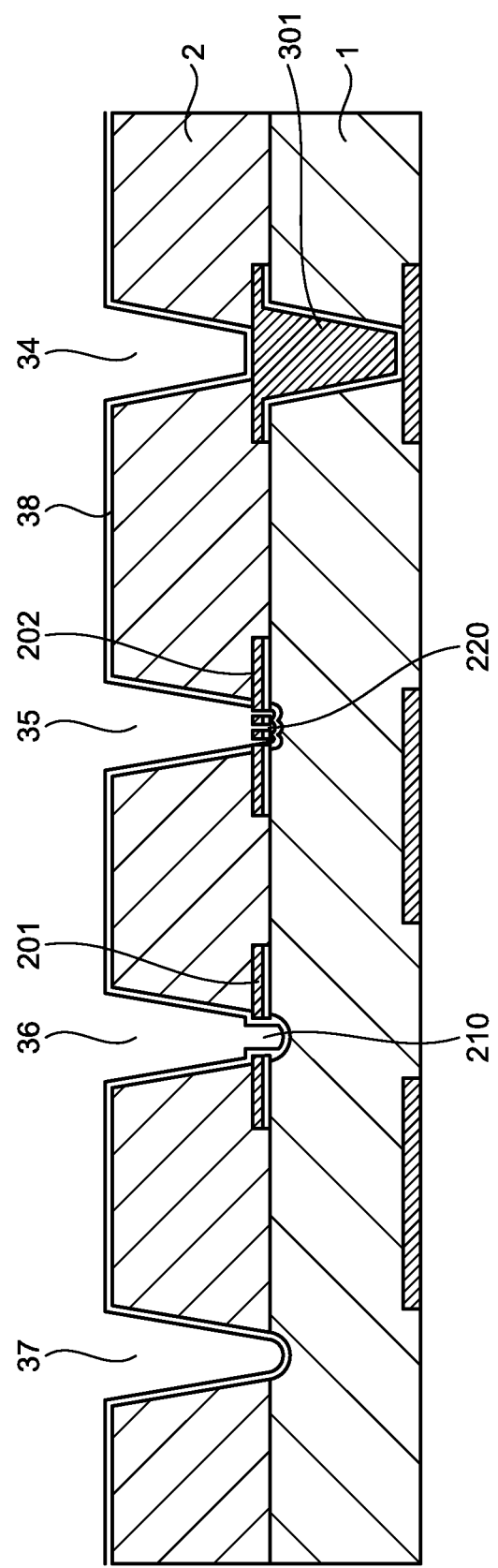
FIG. 5G is a diagram illustrating a method for manufacturing the build-up substrate according to the embodiment.
Figure 7:
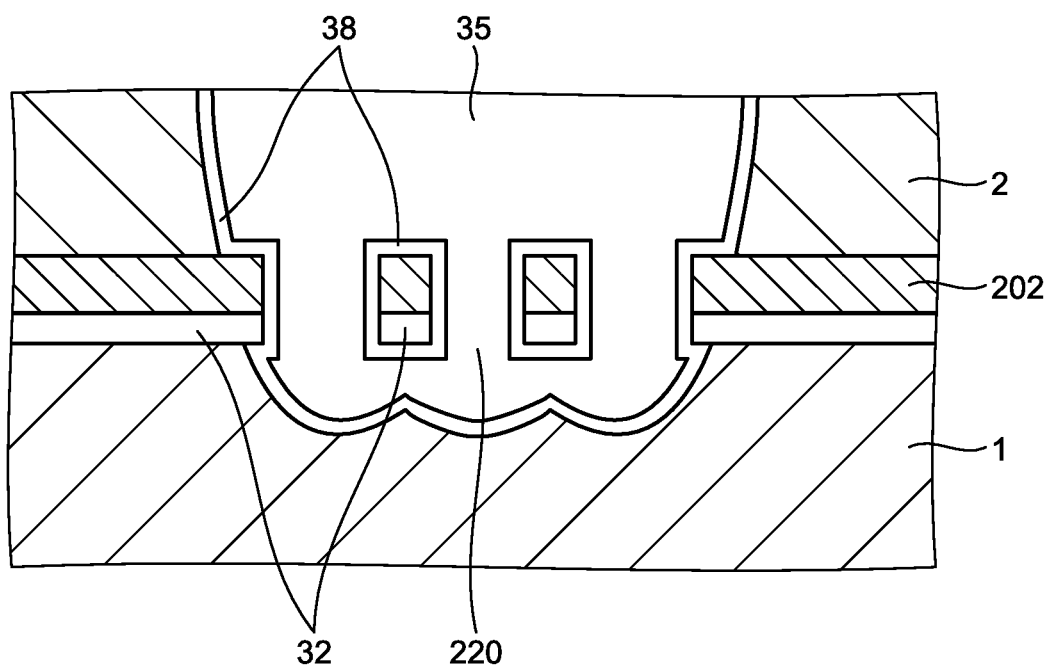
FIG. 7 is an enlarged view of the tip portion of a via 35 in FIG. 5G.

Here, FIG. 7 is an enlarged view of the tip portion of the via 35 in FIG. 5G. As illustrated in FIG. 7, the periphery of each of the members between the through holes 220 in the conductor layer 202 is also covered with the seed layer 38.

The description is continued referring back to FIG. 5G. Next, DFR is laminated on the seed layer 38 formed on the upper surface side of the insulating material layer 2. Next, exposure and development are performed to form a DFR pattern 39. At this time, the openings of the vias 35 to 37 are closed. Next, electrolytic copper plating is applied to the DFR pattern 39. As a result, via fill plating is applied to the via 34, and the conductive via 302 connected to the conductive via 301 is formed. Further, since the openings of the vias 35 to 37 are closed, electrolytic copper plating is not applied to the vias 35 to 37. As a result, the state illustrated in FIG. 5H is obtained.

Figure 5I:
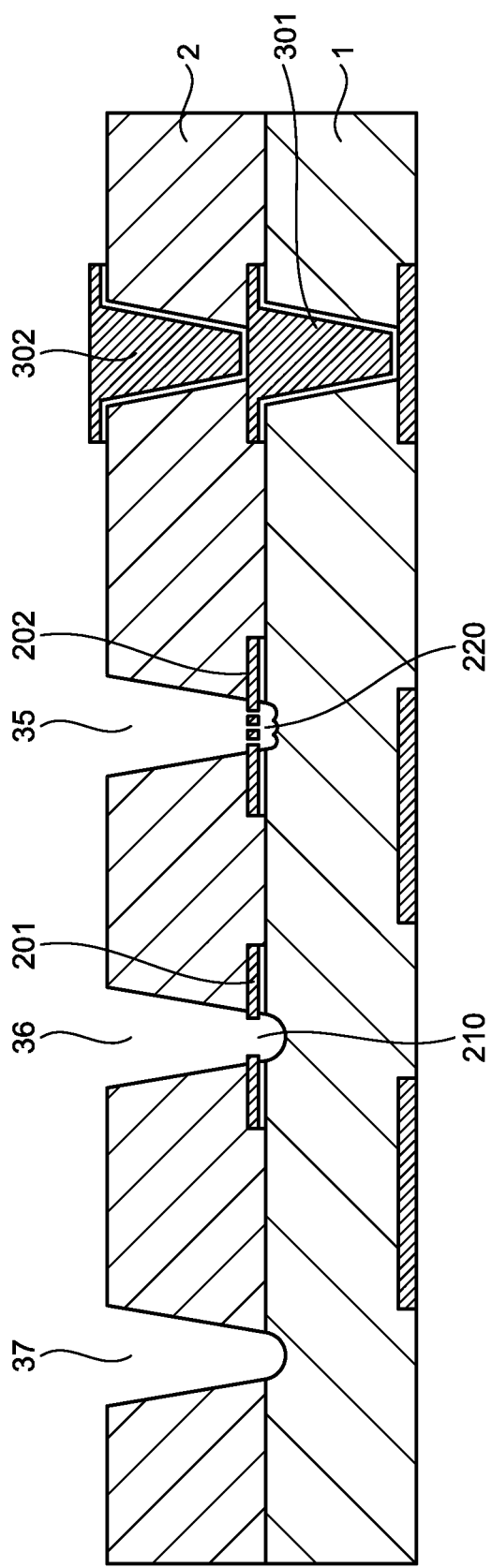
FIG. 5I is a diagram illustrating a method for manufacturing the build-up substrate according to the embodiment.

Next, the DFR is stripped and removed using a stripping solution. Further, the seed layer 38 exposed in the vias 35 to 37 and on the upper surface of the insulating material layer 2, and the seed layers 32 and 38 exposed in the vias 35 and 36 are removed by etching. For example, the seed layer 38 around each of members between the through holes 220 in the conductor layer 202 and the seed layer 32 under each of the members between the through holes 220 illustrated in FIG. 7 are removed by etching. As a result, the state illustrated in FIG. 5I is obtained.

Next, the insulating material layer 3 is stacked on the upper surface of the insulating material layer 2. At this time, the vias 35 to 37 are filled with an insulating material. In this case, the insulating material flows into the insulating material layer 1 side through the through hole 210 of the conductor layer 201 and the through holes 220 of the conductor layer 202, the spaces of the vias 35 and 36 on the insulating material layer 1 side are also filled with the insulating material. As a result, the resin vias 101 to 103 and the insulating material layer 3 illustrated in FIG. 1 are formed. That is, the resin vias 101 and 102, which cover the upper and lower surfaces of the conductor layers 201 and 202 exposed in the vias 35 and 36, and with which the through hole 210 of the conductor layer 201 and the through holes 220 of the conductor layer 202 are filled are formed integrally with the insulating material layer 3.

In the present embodiment, the description after the process of stacking the insulating material layer 3 is not provided. The build-up substrate 5 is completed using the build-up method for processes after the process of stacking the insulating material layer 3.

Furthermore, in the present embodiment, the insulating material layers 1 to 3 are stacked. However, one or more insulating material layers may be further stacked on the insulating material layer 3. In that case, it is preferable to similarly provide the resin vias 101 to 103.

Here, in the present embodiment, the resin vias 101 to 103 have a shape that penetrates the insulating material layer 2 and reaches the next insulating material layer 1, but the resin vias 101 to 103 may have a shape that penetrates the insulating material layer 2, and further penetrates the insulating material layer 1 and a plurality of insulating material layers (not illustrated) under the insulating material layer 1. In that case, the resin vias 101 and 102 may be provided such that the resin vias 101 and 102 penetrate conductor layers other than the conductor layer 201 or 202.

Furthermore, in the present embodiment, the case where the conductor layers 201 and 202 have the through holes 210 and 220, respectively has been described. However, the conductor layers 201 and 202, through which the resin vias 101 and 102 respectively penetrate, may have other shapes.

Figure 8:
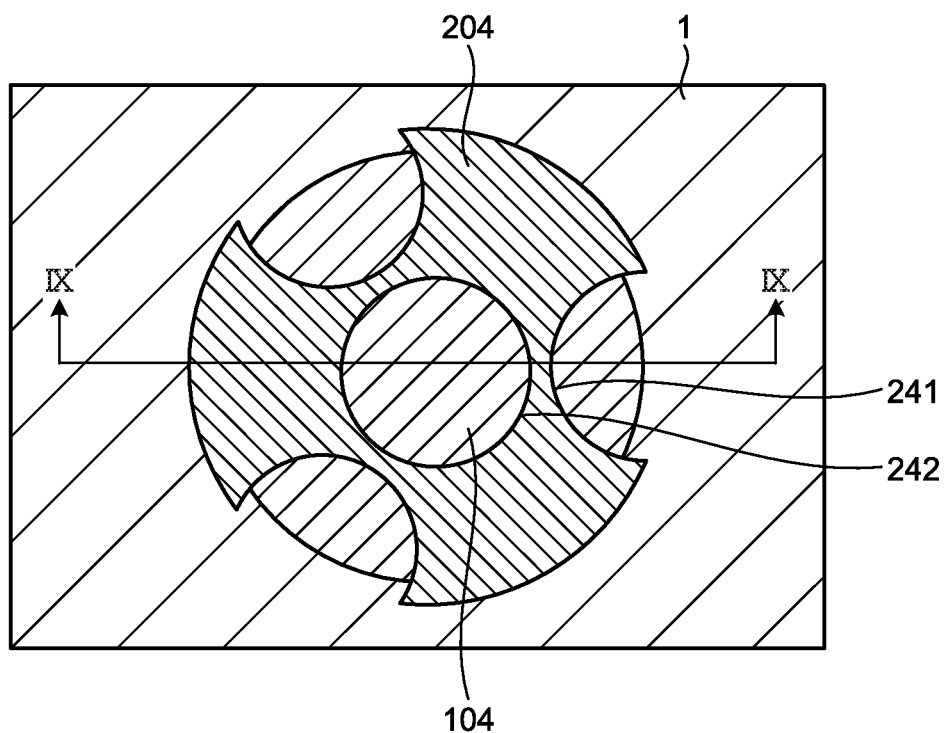
FIG. 8 is a diagram of an example of a conductor layer having cutouts in the outer peripheral portion and a through hole.

FIG. 8 is a diagram of an example of a conductor layer having cutouts in the outer peripheral portion and a through hole. FIG. 8 illustrates a cross section, in the plane direction, of a conductor layer 204 having the cutouts and the through hole in a state where a resin via 104 penetrates similarly to FIGS. 2 and 3. The conductor layer 204 has a cutouts 241 and a through hole 242.

Figure 9:
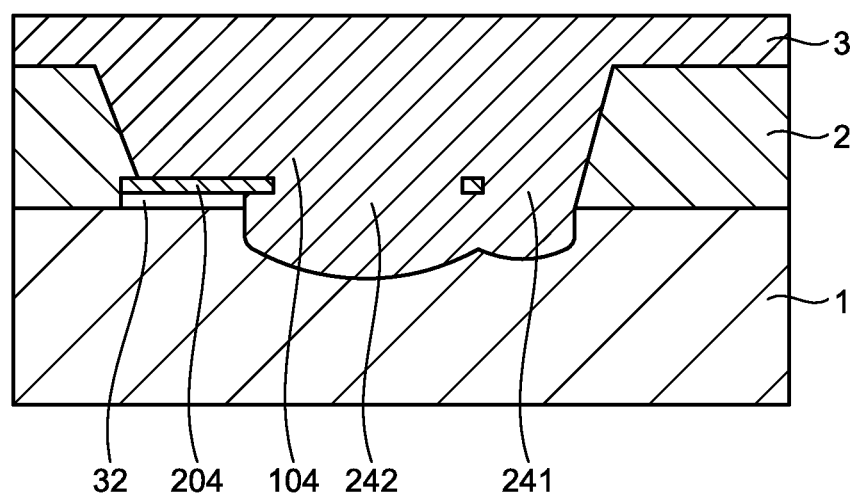
FIG. 9 is a cross-sectional view taken along the line IX-IX of FIG. 8.

FIG. 9 is a cross-sectional view taken along the line IX-IX of FIG. 8. As illustrated in FIG. 9, the resin via 104 penetrating the conductor layer 204 is provided such that the resin via 104 reaches the insulating material layer 1 side through the through hole 242 and the cutouts 241 to cover at least parts of the both sides of the conductor layer 204. In addition, in the resin via 104, a hole under the through hole 242, and holes under the cutouts 241 are connected in a plane direction, and the bottom portion has an uneven shape. As described above, the conductor layer 204 having the cutouts 241 in the outer peripheral portion may be used.

As described above, the multi-layer substrate according to the present embodiment is provided with the resin via that penetrates one insulating material layer and reaches another insulating material layer. Thus, the number of surfaces that adhere increases and thus generation of delamination can be suppressed. In addition, the resin via is provided such that the resin via extends across the interface between the insulating material layer and the insulating material layer or the interface between the insulating material layer and the conductor layer. Thus, it is possible to suppress the progress of delamination that propagates through interfaces. In addition, since the resin via is formed such that the resin via covers at least parts of the both sides of the conductor layer, generation and propagation of delamination between the conductor layer and the insulating material layer can be suppressed by the anchor effect. Moreover, by suppressing the propagation of the delamination, it is possible to suppress the delamination from reaching the interface between the conductor layer and the conductive via, and thus it is possible to ensure electrical conduction and maintain electrical connection reliability.

In addition, since the resin via is made of an insulating material, there is no possibility that unnecessary electrical connection occurs in the conductor layer even if a ground plane or a power plane is used as a conductor layer in which the resin via is provided. Therefore, there are almost no restrictions on the wiring design due to provision of the resin via.

In one aspect, the present invention can reduce occurrence and propagation of delamination.

With regard to the above embodiments, following notes are also disclosed herein.

(Note) A method for manufacturing a multi-layer substrate, including:
forming, on a first insulating layer, a conductor layer having a penetrating portion;
stacking a second insulating layer on the first insulating layer to make a state where the second insulating layer covers the conductor layer;
forming a via hole that penetrates the second insulating layer in a thickness direction from an upper surface of the second insulating layer to reach an inside of the first insulating layer, and that includes the penetrating portion of the conductor layer; and
filling the via hole with an insulating member, and stacking a third insulating layer on the second insulating layer, wherein
the filling the via hole with the insulating member includes filling the via hole with the insulating member to make a state where, in the via hole, the insulating member covers an upper surface side of the conductor layer and covers a lower surface side of the conductor layer through the penetrating portion of the conductor layer.

(Note) A method for manufacturing a multi-layer substrate, including:
forming a conductor pad used for electrical connection on a first insulating layer;
stacking a second insulating layer on the first insulating layer to make a state where the second insulating layer covers the conductor pad;
forming a first via hole that penetrates the second insulating layer in a thickness direction from an upper surface of the second insulating layer to reach the conductor pad;
forming a second via hole that penetrates the second insulating layer in the thickness direction from the upper surface of the second insulating layer to reach an inside of the first insulating layer, and that has a shape identical to a shape of the first via hole;
forming a conductive member in the first via hole by covering the second via hole with a mask; and
filling the second via hole with an insulating member and stacking a third insulating layer on the second insulating layer.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A multi-layer substrate comprising:
a first insulating layer;
a conductor layer that is provided on an upper surface of the first insulating layer and that has a penetrated portion;
a second insulating layer that covers the conductor layer and that is stacked on the upper surface of the first insulating layer;
a via hole that penetrates the second insulating layer from an upper surface of the second insulating layer to reach, through the penetrated portion of the conductor layer, an inside of the first insulating layer lower than the upper surface of the first insulating layer;

an insulating member with which the via hole is filled; and
a third insulating layer that is stacked on the upper surface of the second insulating layer and that is formed integrally with the insulating member, wherein
the conductor layer protrudes from an inside surface of the via hole into the via hole, and
the insulating member contacts and covers an the second insulating layer, both upper and lower surfaces of a portion of the conductor layer protruding from the inside surface and the first insulating layer in the via hole.

2. The multi-layer substrate according to claim 1, wherein the conductor layer is a ground plane or a power plane.

3. The multi-layer substrate according to claim 1, wherein the penetrated portion includes a through hole formed inside the conductor layer or a cutout formed in the outer periphery of the conductor layer.

4. The multi-layer substrate according to claim 3, wherein
the penetrated portion has a plurality of the through hole, and
the via hole includes all of the plurality of the through hole.

5. The multi-layer substrate according to claim 1, further comprising:
a conductor pad that is provided on the upper surface of the first insulating layer and that is used for electrical connection; and
a conductive member that penetrates the second insulating layer and that is connected to the conductor pad.

6. The multi-layer substrate according to claim 5, wherein the conductive member has same shape as the via hole in the second insulating layer.

7. The multi-layer substrate according to claim 1, wherein at least a portion of the via hole overlaps with the penetrated portion of the conductor layer in planar view.

8. The multi-layer substrate according to claim 1, wherein the via hole that is filled with the insulating member overlaps with the portion of the conductor layer protruding from the inside surface in planar view.

9. The multi-layer substrate according to claim 1, wherein the via hole has a tapered shape whose diameter decreases from the upper surface of the second insulating layer to a lower surface of the second insulating layer.

10. The multi-layer substrate according to claim 1, wherein
the third insulating layer is made of same material as the insulating member and is formed integrally with the insulating member in a seamless manner.

11. The multi-layer substrate according to claim 1, wherein
the conductor layer includes:
a seed layer that is provided on the upper surface of the first insulating layer; and
a plating layer that is formed by applying plating on the seed layer, and
the seed layer is smaller than the plating layer in planar view.

12. A multi-layer substrate comprising:
a first insulating layer;
a conductor pad that is provided on an upper surface of the first insulating layer and that is used for electrical connection;
a second insulating layer that covers the conductor pad and that is stacked on the upper surface of the first insulating layer;
a conductive member that penetrates the second insulating layer and that is connected to the conductor pad;
a via hole that penetrates the second insulating layer from an upper surface of the second insulating layer to reach an inside of the first insulating layer lower than the upper surface of the first insulating layer, and that, in the second insulating layer, has a shape identical to a shape of the conductive member;
an insulating member with which the via hole is filled; and
a third insulating layer that is stacked on the upper surface of the second insulating layer and that is formed integrally with the insulating member,
wherein the insulating member contacts and covers the second insulating layer and the first insulating layer in the via hole.

* * * * *